US009275793B2

(12) United States Patent
Yanagihashi et al.

(10) Patent No.: US 9,275,793 B2
(45) Date of Patent: Mar. 1, 2016

(54) CURRENT INPUT CONVERTER

(75) Inventors: Yusuke Yanagihashi, Tokorozawa (JP); Hiroyuki Shirakawa, Fuchu (JP); Toshio Tanaka, Ome (JP); Hiroyuki Maehara, Fuchu (JP); Noriyoshi Suga, Hachioji (JP); Itsuo Shuto, Hachioji (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 955 days.

(21) Appl. No.: 13/476,588

(22) Filed: May 21, 2012

(65) Prior Publication Data

US 2012/0229122 A1 Sep. 13, 2012

Related U.S. Application Data

(63) Continuation of application No. PCT/JP2010/071261, filed on Nov. 29, 2010.

(30) Foreign Application Priority Data

Nov. 30, 2009 (JP) ................................ 2009-271458

(51) Int. Cl.
*G01R 19/25* (2006.01)
*H01F 38/30* (2006.01)

(52) U.S. Cl.
CPC .................................... *H01F 38/30* (2013.01)

(58) Field of Classification Search
CPC ..... G01R 21/06; G01R 15/183; G01R 15/186
USPC ........................................................ 324/127
See application file for complete search history.

(56) References Cited

U.S. PATENT DOCUMENTS

| | | | | |
|---|---|---|---|---|
| 3,183,408 | A * | 5/1965 | Keller et al. | 361/663 |
| 5,519,560 | A * | 5/1996 | Innes et al. | 361/87 |
| 7,548,411 | B2 * | 6/2009 | Yamamura et al. | 361/611 |

FOREIGN PATENT DOCUMENTS

| | | |
|---|---|---|
| CN | 1497622 A | 5/2004 |
| JP | 7-085769 A | 3/1995 |

(Continued)

OTHER PUBLICATIONS

Combined Chinese Office Action and Search Report issued Nov. 5, 2013 in Patent Application No. 201080036320.2 (with English language translation).

(Continued)

*Primary Examiner* — Alesa Allgood

(74) *Attorney, Agent, or Firm* — Oblong, McClelland, Maier & Neustadt, L.L.P.

(57) ABSTRACT

According to one embodiment, a current input converter includes a first metal plate having a solid shape, which has one end attached to the terminal table and one other end attached to one end of a primary-side coil of the transformer, and connects the terminal table and the one end of the primary-side coil of the transformer to each other, and a second metal plate having a solid shape, which has one end attached to the terminal table and one other end attached to one other end of the primary-side coil of the transformer, and connects the terminal table and the other end of the primary-side coil of the transformer to each other.

2 Claims, 12 Drawing Sheets

(56) References Cited

FOREIGN PATENT DOCUMENTS

| | | | |
|---|---|---|---|
| JP | 2003-347139 | A | 12/2003 |
| JP | 2004-166366 | A | 6/2004 |
| JP | 2004-296471 | A | 10/2004 |
| JP | 2008-014773 | A | 1/2008 |

OTHER PUBLICATIONS

International Preliminary Report on Patentability issued on Jul. 19, 2012, in PCT/JP2010/071261, filed Nov. 29, 2010 (submitting English translation only).

Written Opinion of the International Searching Authority issued Feb. 22, 2011, in PCT/JP2010/071261, filed Nov. 29, 2010 (submitting English translation only).

International Search Report mailed on Febraury 22, 2011, issued for International Application No. PCT/JP2010/071261, filed Nov. 29, 2010 (with English translation).

International Written Opinion mailed on Febraury 22, 2011, issued for International Application No. PCT/JP2010/071261, filed Nov. 29, 2010.

* cited by examiner

CURRENT INPUT CONVERTER

CROSS-REFERENCE TO RELATED APPLICATIONS

This application is a Continuation Application of PCT Application No. PCT/JP2010/071261, filed Nov. 29, 2010 and based upon and claiming the benefit of priority from prior Japanese Patent Application No. 2009-271458, filed Nov. 30, 2009, the entire contents of all of which are incorporated herein by reference.

FIELD

Embodiments described herein relate generally to a current input converter which internally handles a current input from outside.

BACKGROUND

For example, a protective relay apparatus performs an accident determination calculation depending on a size or a phase condition of an input current to an electric power system. When an accident occurs in a protective block, a gate is instructed to remove the block causing the accident, to protect the safe power system. In this protective relay apparatus, a current input converter is provided to convert an external input current into a predetermined analog amount. Through the current input converter, the external input current is taken into a terminal table in the protective relay apparatus by an instrument transformer. The input current is electrically isolated and converted into a predetermined analog amount by an internal transformer. The analog amount is further converted into a digital amount to perform a calculation processing for an accident determination.

Generally, when a current is taken in from an electric power system into a protective relay apparatus, connection from a terminal table as an input unit of the protective relay apparatus to a primary side of a transformer inside the protective relay apparatus is formed by wiring based on direct conduction or by a patterned conductor on a printed circuit board built in the protective relay apparatus.

In this case, there is a need to reduce resistance from the input unit of the protective relay apparatus to a primary side of the transformer inside the protective relay apparatus, in order to ensure an excessive current tolerance for the input unit. Hence, a thick lead such as a copper wire which has a sufficient line diameter is used when wiring is employed. A pattern width is increased when a patterned conductor is used.

Then, when wiring is employed, spaces for terminal connection and for wiring work are required to connect the terminal table as the input unit of the protective relay apparatus and the lead wire inside the protective relay apparatus, and consequently limit the size of the protective relay apparatus. On the other side, when a pattern on the printed circuit board is used for connection from the terminal table as the input unit of the protective relay apparatus to the primary side of the transformer, double-sided patterning is required or a sufficient pattern width is required in order to suppress increase in temperature of a pattern. Upon necessity, consideration is required to increase a pattern film thickness and consequently limits pattern designing and the size of the printed circuit board. In case of wiring a lead, wiring work is required and therefore causes a possibility of a wiring error when the protective relay apparatus is assembled.

In a structure of mounting a transformer aiming at downsizing/thinning and weight reduction, a transformer is inserted into a through hole formed in a printed circuit board, and a secondary coil is wound about a coil bobbin of the transformer. Support legs extending in mutually opposite directions are formed integrally on the coil bobbin. The support legs are bridged over an open end surface of the through hole on a surface side of the printed circuit board. The transformer is configured to suspend from the printed circuit board and is thereby fixed to the printed circuit board (for example, see Jpn. Pat. Appln. KOKAI Publication No. 2004-296471 (hereinafter referred to as "Patent Document 1")).

In Patent Document 1, however, downsizing/thinning is achieved by modifying the structure of the transformer to simplify assembly of the transformer, and reduction in resistance of a wire or a patterned conductor from a terminal table to a primary side of a transformer inside a protective relay apparatus is not intended. That is, the structure disclosed in Patent Document 1 needs to ensure a sufficient size for the printed circuit board in order to maintain a wiring space or a pattern space on the printed circuit board. Therefore, an input unit of the protective relay apparatus cannot be downsized. In addition, neither wiring work between the terminal table and the primary side of the transformer inside the protective relay apparatus nor wiring check work for preventing wiring errors can be easily carried out.

Under the circumstances, it is desired to provide a current input converter which can shorten connection from a terminal table as an input unit to a primary side of an internal transformer, to satisfy an excessive current tolerance, and can improve work efficiency by preventing wiring errors.

DETAILED DESCRIPTION

Embodiments will be described with reference to the drawings.

In general, according to one embodiment, there is provided a current input converter. The current input converter includes: a terminal table which takes in an input current from outside; a transformer which electrically isolates the input current taken in by the terminal table and converts the input current into a predetermined analog signal; an analog-to-digital conversion circuit which converts the analog signal obtained by the transformer into a digital signal; a first metal plate having a solid shape, which has one end attached to the terminal table and one other end attached to one end of a primary-side coil of the transformer, and connects the terminal table and the one end of the primary-side coil of the transformer to each other; and a second metal plate having a solid shape, which has one end attached to the terminal table and one other end attached to one other end of the primary-side coil of the transformer, and connects the terminal table and the other end of the primary-side coil of the transformer to each other.

Figure 1:
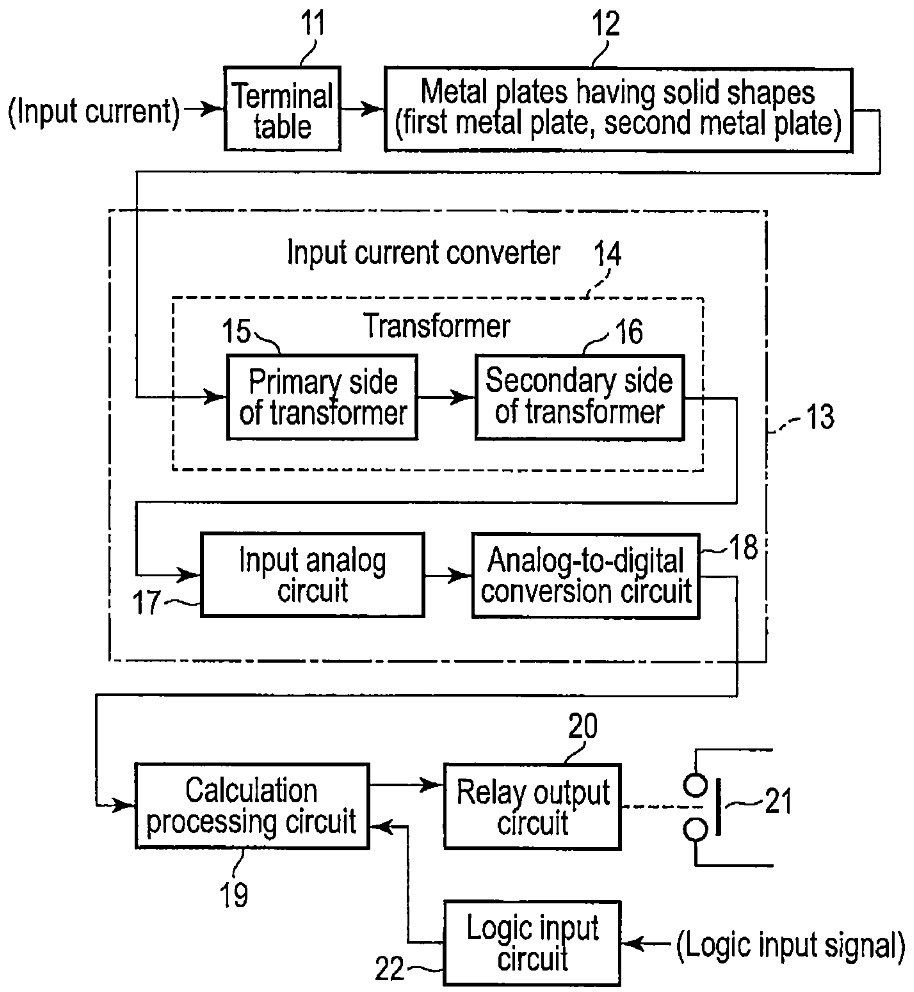
FIG. 1 is a block diagram in which a current input converter according to an embodiment of the invention.

Hereinafter, embodiments of the invention will be described. FIG. 1 is a block diagram in which a current input converter according to an embodiment of the invention is applied to an input unit of a protective relay apparatus. In the following, descriptions will be given of a case of application as an apparatus to a protective relay apparatus. In FIG. 1, an external input current is input to a terminal table 11 of the current input converter. The input current input to the terminal table 11 is input to a transformer 14 of a current input converter 13 through a metal plate 12 having a solid shape. In the embodiment of the invention, the terminal table 11 and the transformer 14 are connected to each other by the metal plate 12 having a solid shape. Details of the metal plate 12 having a solid shape will be described later.

That is, an input current as an external analog amount to the current input converter is input to the terminal table 11, and is then input to a primary side 15 of a transformer 14 through a metal plate 12 having a solid shape. The metal plate 12 having the solid shape is formed of a copper plate having a small electrical resistance and a solid shape, and transfers the input current to a primary side 15 of the transformer.

The primary side 15 of the transformer is electrically isolated from a secondary side 16 of the transformer. The input current transferred to the primary side 15 of the transformer is transferred as a predetermined analog amount, and is input to an analog input circuit 17. The analog input circuit 17 converts the input analog amount into a predetermined analog amount, and outputs the amount to an analog-to-digital conversion circuit 18.

The analog-to-digital converter 18 is input with the analog signal which is output from an analog input circuit 17 and converts the analog signal into a predetermined digital signal. This digital signal is taken into a calculation processing circuit 19, and performs a predetermined calculation processing. A calculation result of the calculation processing circuit 19 is output as an accident determination result for the electric power system to a relay output circuit 20. When an accident occurs in a protective block in the protective relay apparatus, the relay output circuit 20 outputs an instruction to the outside through a contact output 21.

In the logic input circuit 22, the calculation processing circuit 19 is input with a logic input signal which is used in a calculation processing for an accident determination, when an external contact point which controls a logic input signal voltage input to the logic input circuit 22 closes and the logic input signal voltage is input to a logic input circuit 22 of the protective relay apparatus.

Figure 2:
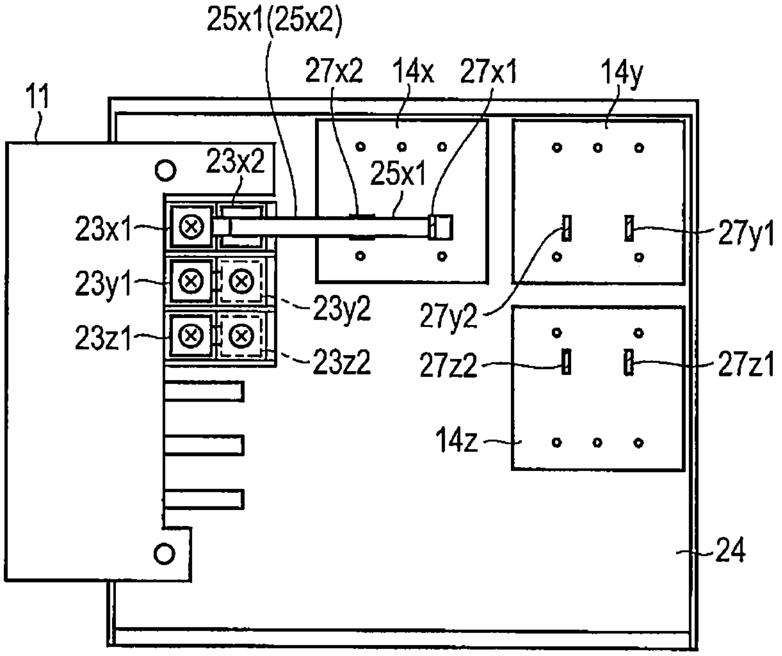
FIG. 2 is a plan view of a connection part between a terminal table and an X-phase transformer in the current input converter according to the embodiment of the invention.
Figure 3:
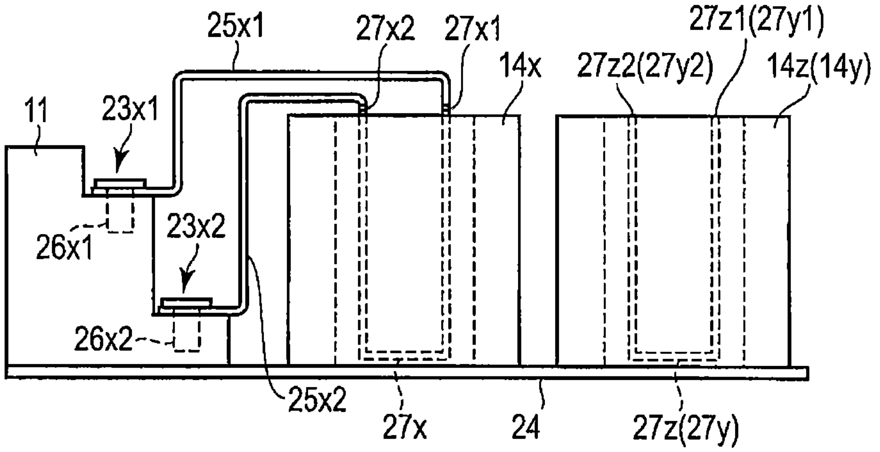
FIG. 3 is a side view of FIG. 2.

FIG. 2 is a plan view of a connection part between the terminal table 11 and an X-phase transformer 14*x* in the current input converter according to the embodiment of the invention. FIG. 3 is a side view of FIG. 2. FIGS. 2 and 3 show a case where a mono-phase transformer 14*x* among mono-phase transformers 14*x* to 14*z* is connected to connection parts 23*x*1 and 23*x*2 among connection parts 23*x*1, 23*x*2 to 23*z*1, and 23*z*2 of the terminal table 11.

In FIGS. 2 and 3, an end of a first metal plate 25*x*1 is fixed by a screw 26*x*1 to the connection part 23*x*1 of the terminal table 11 mounted on the printed circuit board 24, and an end 27*x*1 of a primary-side coil 27*x* of the transformer 14*x* is connected to the other end of the first metal plate 25*x*1. Similarly, an end of a second metal plate 25*x*2 is fixed by a screw to the connection part 23*x*2 of the terminal table 11 mounted on the printed circuit board 24, and an end 27*x*2 of the primary-side coil 27*x* of the transformer 14*x* is connected to the other end of a second metal plate 25*x*2. The second metal plate 25*x*2 is shown, as an example, where an end thereof is attached at a position with a gap maintained from an attachment position thereof to the first metal plate 25*x*1.

Thus, an end of the first metal plate 25*x*1 is attached to an upper connection part 23*x*1 of the terminal table 11 and extends over the second metal plate 25*x*2. The other end thereof is connected to an end 27*x*1 of the primary-side coil 27*x* of the transformer 14*x*. On the other side, an end of the second metal plate 25*x*2 is attached to a lower connection part 23*x*2 of the terminal table 11 and extends below the first metal plate 25*x*1. The other end thereof is connected to the other end 27*x*2 of the primary-side coil 27*x* of the transformer 14*x*.

Figure 4:
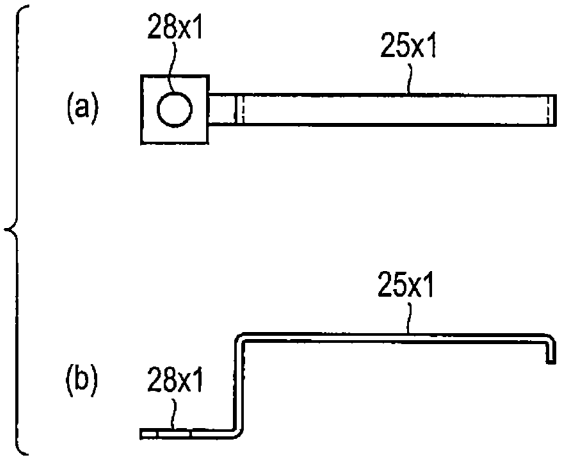
FIG. 4 is a structural view of a first metal plate which connects a terminal table and an X-phase transformer according to the embodiment of the invention.
Figure 5:
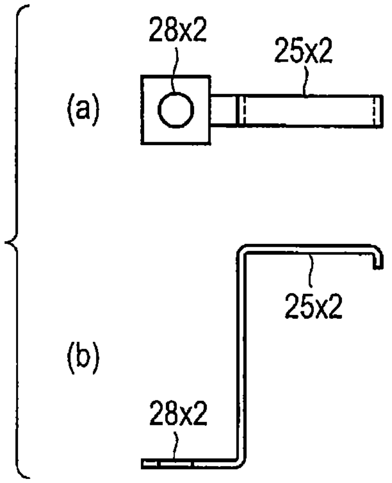
FIG. 5 is a structural view of a second metal plate which connects the terminal table and the X-phase transformer according to the embodiment of the invention.

FIG. 4 is a structural view of the first metal plate 25*x*1 which forms connection between the terminal table 11 and the X-phase transformer 14*x*. FIG. 4(*a*) is a plan view and FIG. 4(*b*) is a side view. Further, FIG. 5 is a structural view of the second metal plate 25*x*2 which forms connection between the terminal table 11 and the X-phase transformer 14*x*. FIG. 5(*a*) is a plan view and FIG. 5(*b*) is a side view.

The first metal plate 25*x*1 is connected from the upper connection part 23*x*1 of the terminal table 11 to an end 27*x*1 of the primary-side coil 27_x_ of the transformer 14_x_, and is therefore formed to be laterally greater and longitudinally smaller than the second metal plate 25_x_2. Further, the second metal plate 25_x_2 is connected from the lower connection part 23_x_2 of the terminal table 11 to the other end 27_x_2 of a secondary coil 27_x_ of the transformer 14_x_, and is therefore formed to be laterally smaller and longitudinally greater than the first metal plate 25_x_1. Still further, holes 28_x_1 and 28_x_2 for inserting the screws 26_x_1 and 26_x_2 to connect with the terminal table 11 are provided.

The first metal plate 25_x_1 and second metal plate 25_x_2 each are formed of a copper plate having a solid shape and a low electrical resistance. This is because, if once layout positions of the terminal table 11 and transformers 14 are determined, distances between the connection parts 23 of the terminal table 11 and the primary-side coils 27 of the transformers 14 are determined. Accordingly, the first metal plate 25_x_1 and second metal plate 25_x_2 can be formed in solid shapes as shown in FIGS. 4 and 5.

Figure 6:
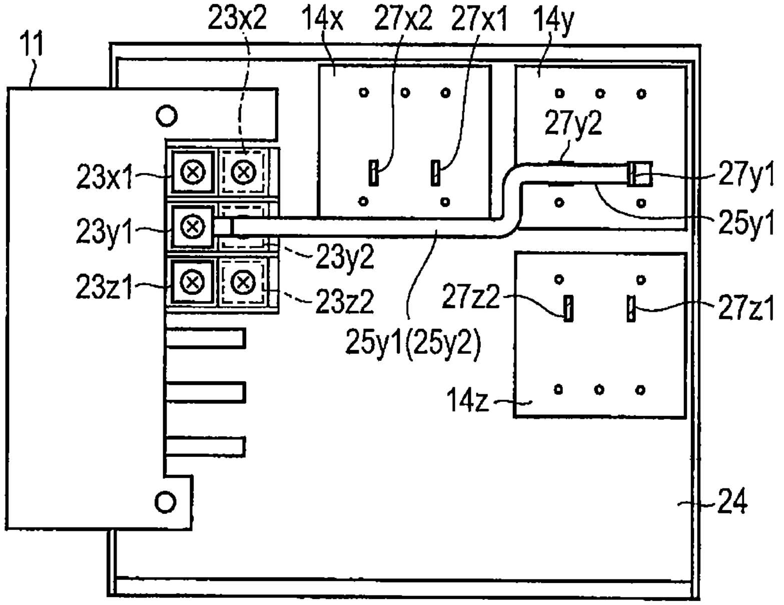
FIG. 6 is a plan view of a connection part between a terminal table and a Y-phase transformer according to an embodiment of the invention.
Figure 7:
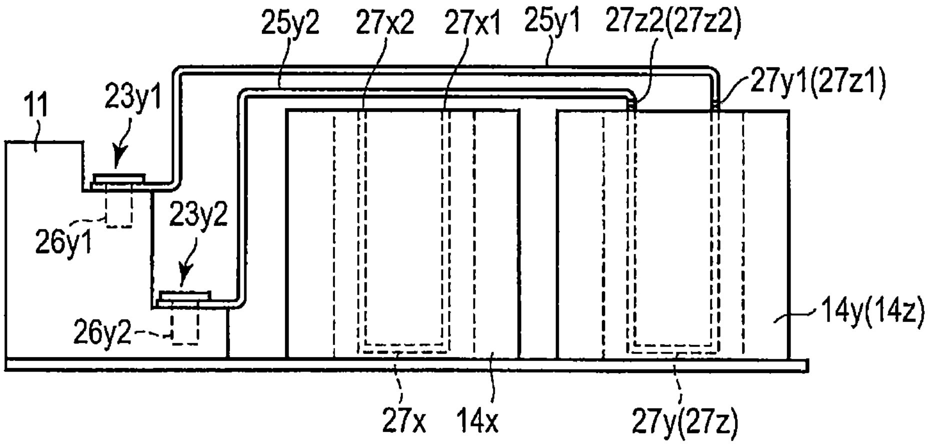
FIG. 7 is a side view of FIG. 6.
Figure 8:
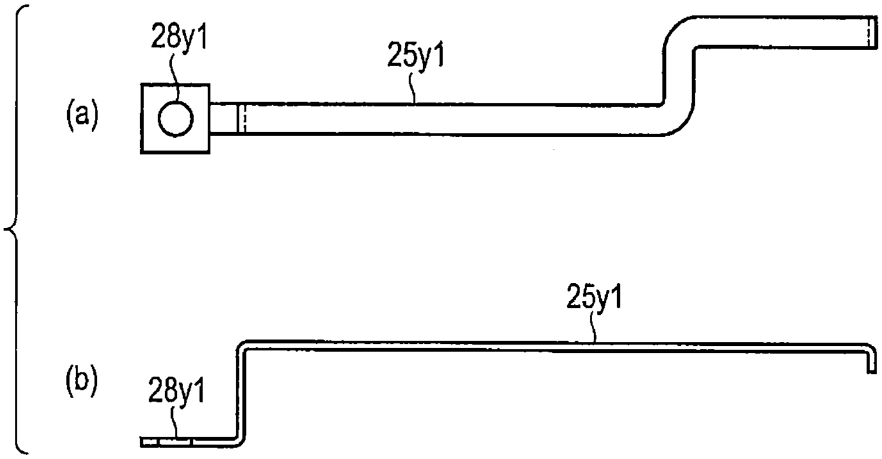
FIG. 8 is a structural view of a first metal plate which connects the terminal table and the Y-phase transformer according to the embodiment of the invention.
Figure 9:
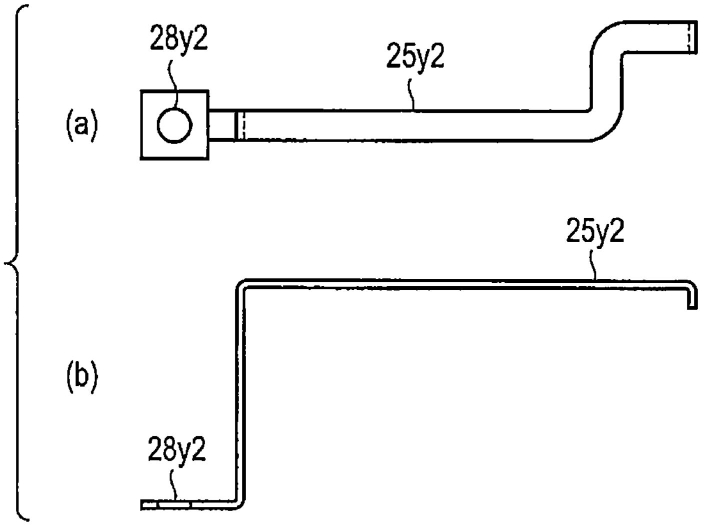
FIG. 9 is a structural view of a second metal plate which connects the terminal table and the Y-phase transformer according to the embodiment of the invention.

FIG. 6 is a plan view of a connection part between the terminal table 11 and a Y-phase transformer 14_y_ in the current input converter according to the embodiment of the invention. FIG. 7 is a side view of FIG. 6. FIG. 8 is a structural view of a first metal plate 25_y_1 which forms connection between the terminal table 11 and Y-phase transformer 14_y_. FIG. 8(_b_) is a plan view of FIG. 8(_a_). FIG. 9 is a structural view of a second metal plate 25_y_2 which forms connection between the terminal table 11 and Y-phase transformer 14_y_. FIG. 9(_a_) is a plan view and FIG. 9(_b_) is a side view.

FIGS. 6 and 7 show a case where the mono-phase transformer 14_y_ among mono-phase transformers 14_x_ to 14_z_ is connected to the connection parts 23_y_1 and 23_y_2 among the connection parts 23_x_1, 23_x_2 to 23_z_1, and 23_z_2 of the terminal table 11. As shown in FIGS. 6 and 7, an end of the first metal plate 25_y_1 is attached to an upper connection part 23_y_1 of the terminal table 11 and extends over the second metal plate 25_y_2. The other end thereof is connected to an end 27_y_1 of the primary-side coil 27_y_ of the transformer 14_y_. On the other side, an end of the second metal plate 25_y_2 is attached to a lower connection part 23_y_2 of the terminal table 11 and extends below the first metal plate 25_y_1. The other end thereof is connected to the other end 27_y_2 of the primary-side coil 27_y_ of the transformer 14_y_.

The first metal plate 25_y_1 is connected from the upper connection part 23_y_1 of the terminal table 11 to an end 27_y_1 of the primary-side coil 27_y_ of the transformer 14_y_, and is therefore formed to be laterally greater and longitudinally smaller than the second metal plate 25_y_2, as shown in FIG. 8. The second metal plate 25_y_2 is connected from the lower connection part 23_y_2 of the terminal table 11 to the other end 27_y_2 of the secondary coil 27_y_ of the transformer 14_y_, and is therefore formed to be laterally smaller and longitudinally greater than the first metal plate 25_y_1, as shown in FIG. 9. Still further, holes 28_y_1 and 28_y_2 for inserting screws 26_y_1 and 26_y_2 to connect with the terminal table 11 are provided.

The first metal plate 25_y_1 and second metal plate 25_y_2 each are formed of a copper plate having a solid shape and a low electrical resistance. This is because, if once layout positions of the terminal table 11 and transformers 14 are determined, distances between the connection parts 23 of the terminal table 11 and the primary-side coils 27 of the transformers 14 are determined. Accordingly, the first metal plate 25_y_1 and second metal plate 25_y_2 can be formed in solid shapes as shown in FIGS. 8 and 9.

Figure 10:
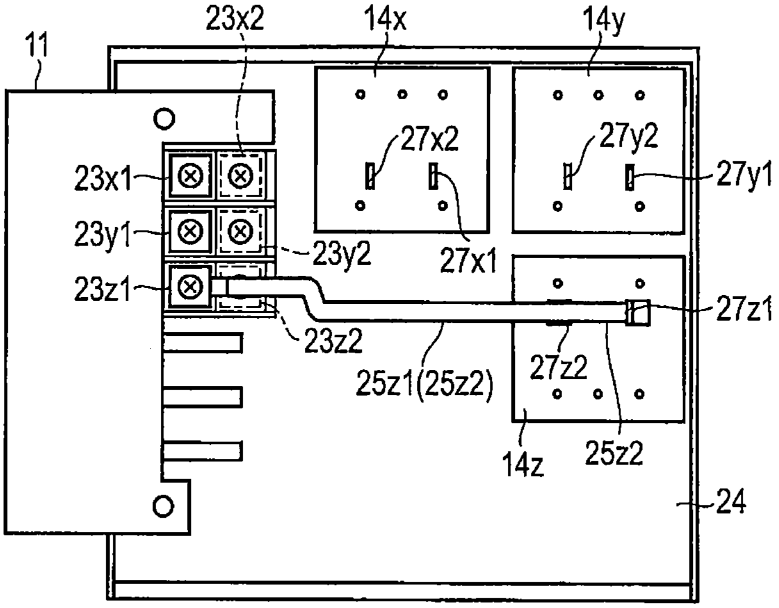
FIG. 10 is a plan view of a connection part between the terminal table of the current input converter and a Z-phase transformer according to the embodiment of the invention.
Figure 11:
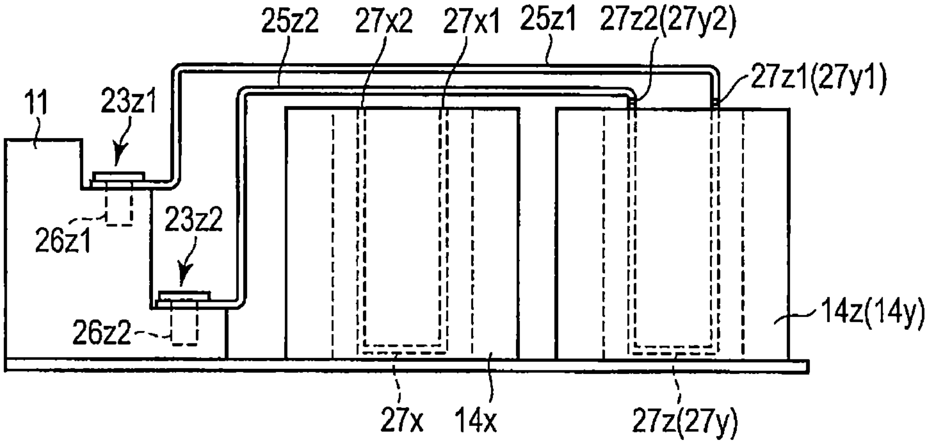
FIG. 11 is a side view of FIG. 10.
Figure 12:
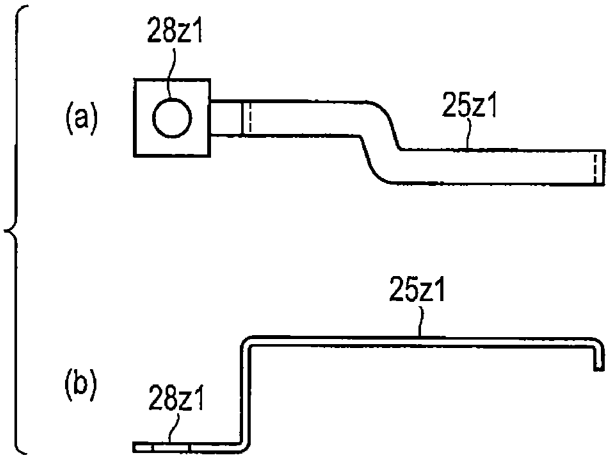
FIG. 12 is a structural view of a first metal plate which connects the terminal table and the Z-phase transformer according to the embodiment of the invention.
Figure 13:
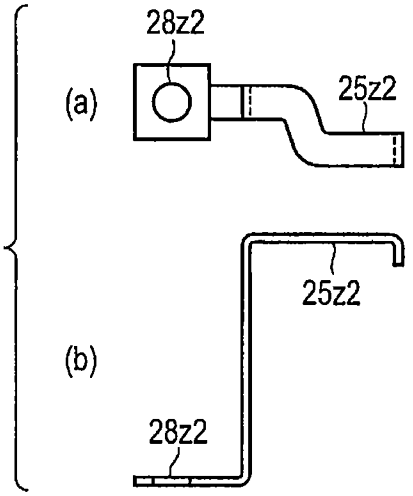
FIG. 13 is a structural view of a second metal plate which connects the terminal table and the Z-phase transformer according to the embodiment of the invention.

FIG. 10 is a plan view of a connection part between the terminal table 11 and a Z-phase transformer 14_z_ in the current input converter according to the embodiment of the invention. FIG. 11 is a side view of FIG. 10. FIG. 12 is a structural view of a first metal plate 25_z_1 which forms connection between the terminal table 11 and Z-phase transformer 14_z_. FIG. 12(_a_) is a plan view and FIG. 12(_b_) is a side view. FIG. 13 is a structural view of a second metal plate 25_z_2 which forms connection between the terminal table 11 and a Z-phase transformer 14_z_. FIG. 13(_a_) is a plan view and FIG. 13(_b_) is a side view.

FIGS. 10 and 11 show a case where the mono-phase transformer 14_y_ among the mono-phase transformers 14_x_ to 14_z_ is connected to the connection parts 23_z_1 and 23_z_2 among the connection parts 23_x_1, 23_x_2 to 23_z_1, and 23_z_2 of the terminal table 11.

As shown in FIGS. 10 and 11, an end of the first metal plate 25_z_1 is attached to an upper connection part 23_z_1 of the terminal table 11 and extends over the second metal plate 25_z_2. The other end thereof is connected to an end 27_z_1 of the primary-side coil 27_z_ of the transformer 14_z_. On the other side, an end of the second metal plate 25_z_2 is attached to a lower connection part 23_z_2 of the terminal table 11 and extends below the first metal plate 25_z_1. The other end thereof is connected to the other end 27_z_2 of the primary-side coil 27_z_ of the transformer 14_z_.

The first metal plate 25_z_1 is connected from the upper connection part 23_z_1 of the terminal table 11 to an end 27_z_1 of the primary-side coil 27_z_ on the primary side of the transformer 14_z_, and is therefore formed to be laterally greater and longitudinally smaller than the second metal plate 25_z_2. The second metal plate 25_z_2 is connected from the lower connection part 23_z_2 of the terminal table 11 to the other end 27_z_2 of the secondary coil 27_z_ on the secondary side of the transformer 14_z_, and is therefore formed to be laterally smaller and longitudinally greater than the first metal plate 25_z_1, as shown in FIG. 9. Still further, holes 28_z_1 and 28_z_2 for inserting screws 26_y_1 and 26_y_2 to connect with the terminal table 11 are provided.

The first metal plate 25_z_1 and second metal plate 25_z_2 each are formed of a copper plate having a solid shape and a low electrical resistance. This is because, if once layout positions of the terminal table 11 and transformers 14 are determined, distances between the connection parts 23 of the terminal table 11 and the primary-side coils 27 of the primary side of the transformers 14 are determined. Accordingly, the first metal plate 25_z_1 and second metal plate 25_z_2 can be formed in solid shapes as shown in FIGS. 12 and 13.

Figure 14:
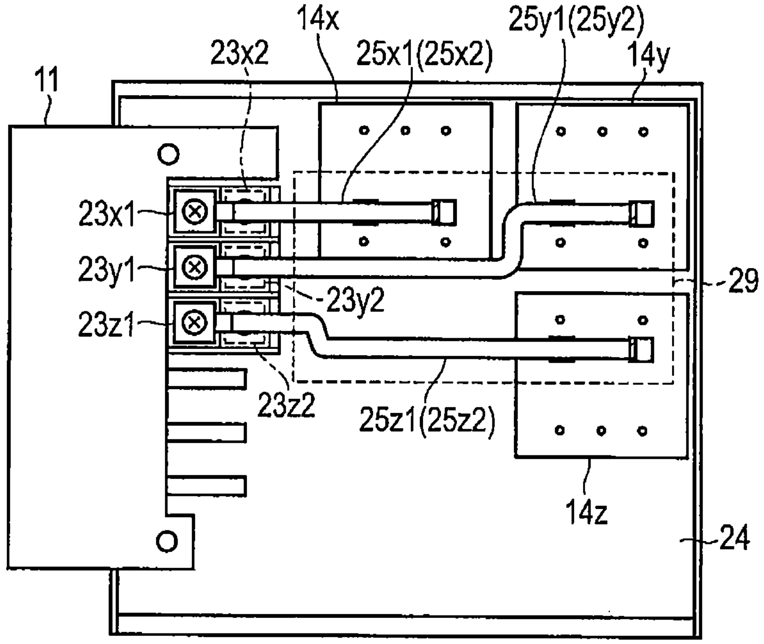
FIG. 14 is a plan view of Example 1 of a connection part between the terminal table of the current input converter and the X-, Y-, and Z-phase transformers according to the embodiment of the invention.
Figure 15:
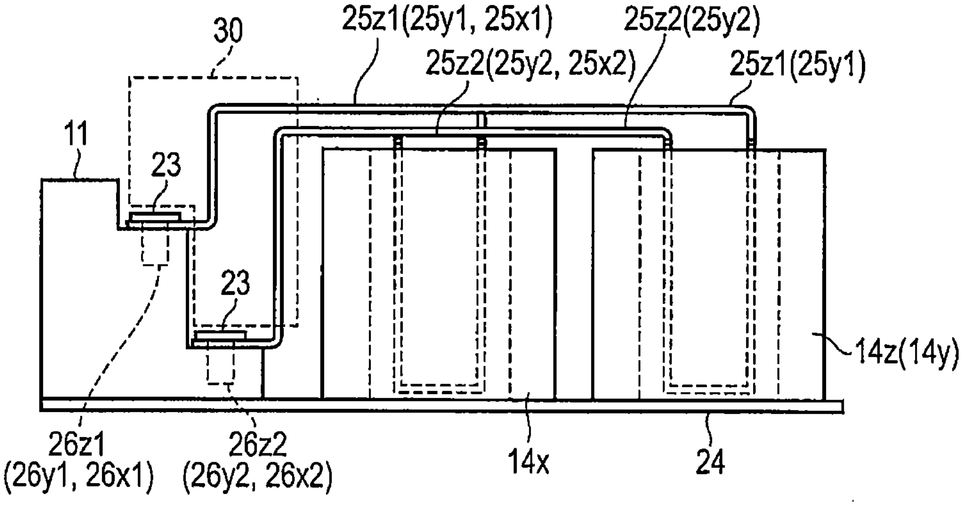
FIG. 15 is a side view of FIG. 14.

FIG. 14 is a plan view of Example 1 of a connection part between the terminal table 11 and the X-, Y-, and Z-phase transformers 14_x_ to 14_z_ in the current input converter according to the embodiment of the invention. FIG. 15 is a side view of FIG. 14. In FIG. 14, a reference sign 29 denotes a pattern wiring space where the X-, Y-, and Z-phase transformers 14_x_ to 14_z_ are connected by a wiring pattern on the printed circuit board 24. A reference sign 30 in FIG. 15 denotes a lead wire space where the terminal table 11 and the X-, Y-, and Z-phase transformers 14_x_ to 14_z_ are connected by wiring.

When the terminal table 11 and the X-, Y-, and Z-phase transformers 14_x_ to 14_z_ are connected by a wiring pattern on the printed circuit board 24, double-sided patterning and a pattern width need to be ensured. Upon necessity, consideration is required to increase a pattern film thickness. Therefore, the pattern wiring space 29 of the printed circuit board 24 needs to be sufficiently wide. In the embodiment of the invention, the first metal plates 25_x_1 to 25_z_1 and second metal plates 25_x_2 to 25_z_2 are configured to have solid shapes, and therefore, connection can be made between the terminal table 11 and the transformers 14 with ensuring an excessive current tolerance and without depending on the size of the pattern wiring space 29 of the printed circuit board 24.

When the terminal table 11 and the X-, Y-, and Z-phase transformers 14*x* to 14*z* are connected by wiring leads, thick leads need to be used, and connection terminals for connecting the terminal table 11 to the leads also need to be used. Accordingly, the lead wiring space 30 needs to be sufficiently wide. In the embodiment of the invention, the first metal plates 25*x*1 to 25*z*1 and second metal plates 25*x*2 to 25*z*2 are configured to have solid shapes, and therefore, connection can be made between the terminal table 11 and the transformers 14 with ensuring an excessive current tolerance and without depending on the size of the pattern wiring space 29 of the printed circuit board 24. Since holes 28 for inserting screws 26 to connect with the terminal table 11 are provided in the first metal plates 25*x*1 to 25*z*1 and the second metal plates 25*x*2 to 25*z*2, no connection terminal is required any more, and the lead wiring space 30 can be reduced to minimum. Therefore, a current input converter of a small size can be provided.

The first metal plates 25*x*1 to 25*z*1 and the second metal plates 25*x*2 to 25*z*2 described above may be subjected to a plating process for corrosion prevention. Further, the first metal plates 25*x*1 to 25*z*1 and the second metal plates 25*x*2 to 25*z*2 have respectively different solid shapes to connect with corresponding ones of the transformers 14*x* to 14*y*, depending on locations of the transformers 14*x* to 14*y* mounted on the printed circuit board 24, as shown in FIGS. 4, 5, 8, 9, 12, and 13. Therefore, the metal plates are not erroneously connected but work efficiency can be improved in assembly according to FIG. 20.

Figure 20:
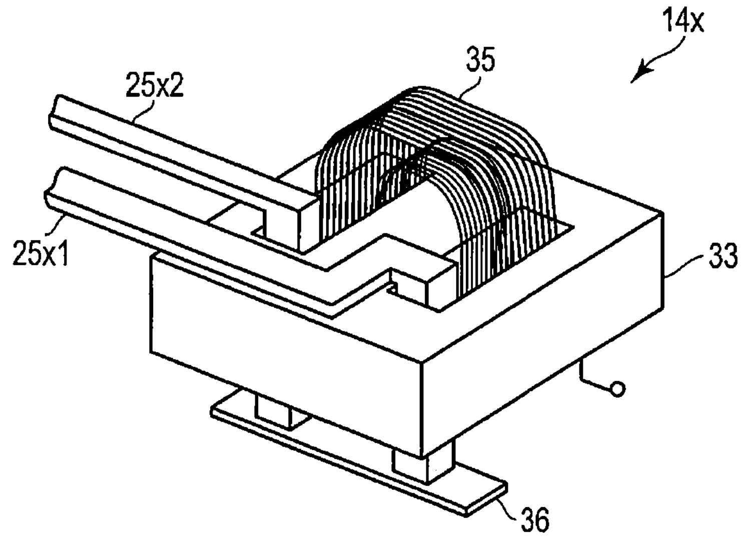
FIG. 20 is a perspective view of FIG. 19 where the transformer in the embodiment of the invention is a transformer using an EI core.

Further, peripheries of the first metal plates 25*x*1 to 25*z*1 and the second metal plates 25*x*2 to 25*z*2 may be covered with an electrically insulating coating or an electrically insulating material. By subjecting the first metal plates 25*x*1 to 25*z*1 and the second metal plates 25*x*2 to 25*z*2 to an insulating process, the copper plates are not short-circuited to each other even if a foreign material is mixed in between the first metal plates 25*x*1 to 25*z*1 and the second metal plates 25*x*2 to 25*z*2. An input current as an external analog amount as shown in FIG. 20 can be correctly transferred to primary sides of the transformers, and reliability of the protective relay apparatus can be improved. Further, even if a person touches the first metal plates 25*x*1 to 25*z*1 and the second metal plates 25*x*2 to 25*z*2, electric shocks can be prevented and safety can be improved.

Figure 16:
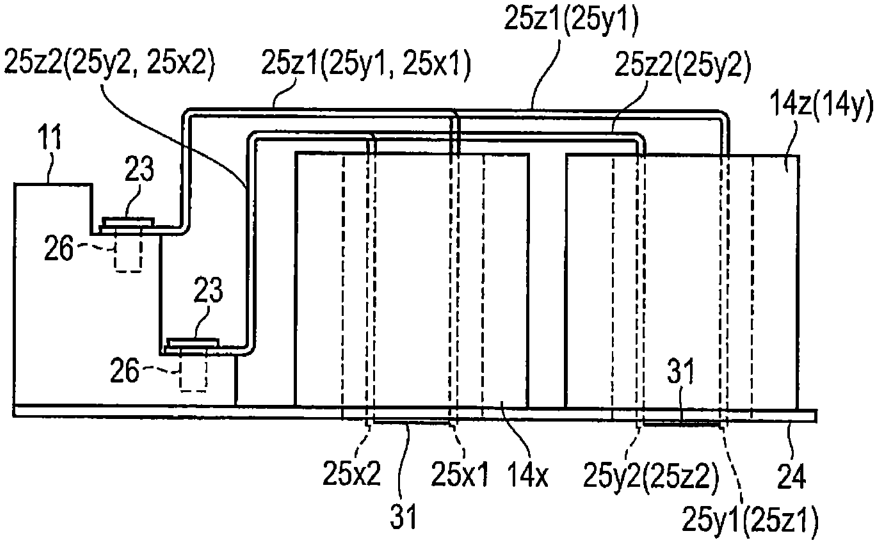
FIG. 16 is a plan view of Example 2 of a connection part between the terminal table of the current input converter and the X-, Y-, and Z-phase transformers according to the embodiment of the invention.

FIG. 16 is a plan view of Example 2 of a connection part between the terminal table 11 and the X-, Y-, and Z-phase transformers in the current input converter according to the embodiment of the invention. This Example 2 is achieved by modifying Example 1 shown in FIG. 14 in a manner that first metal plates 25*x*1 to 25*z*1 and second metal plates 25*x*2 to 25*z*2 are made to penetrate a printed circuit board 24 where the transformers 14*x* to 14*y* are mounted, the first metal plates 25*x*1 to 25*z*1 and the second metal plates 25*x*2 to 25*z*2 are connected by patterned wires 31 on the back of the printed circuit board 24, thereby to form primary-side coils of the transformers 14*x* to 14*y*. In this manner, stability improves against vibrations and impacts so that reliability in connection with the primary sides of the transformers 14 mounted on the printed circuit board 24 can be improved.

Figure 17:
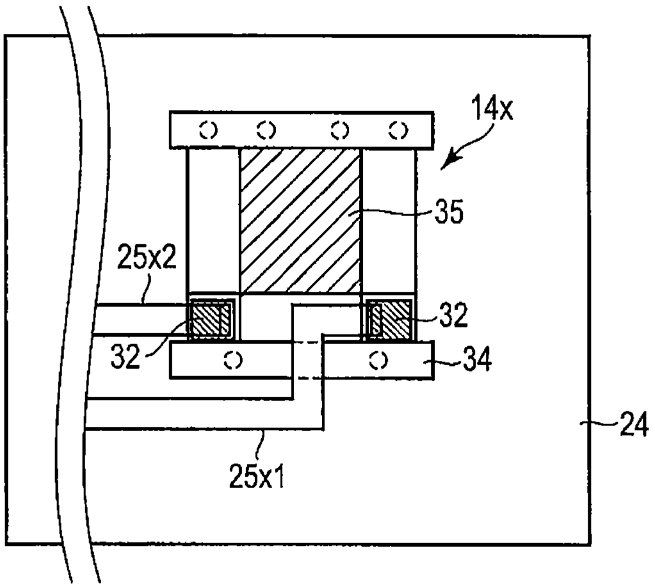
FIG. 17 is a partially-cutaway plan view of FIG. 16 where a transformer in the embodiment of the invention is a transformer using an EI core.
Figure 18:
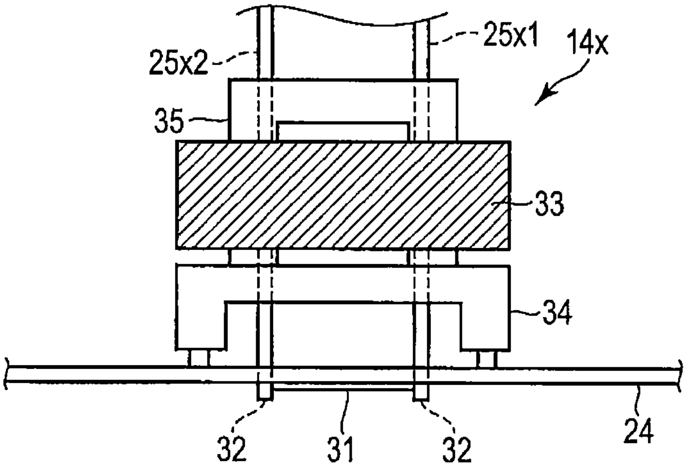
FIG. 18 is a side view of FIG. 17.

FIG. 17 is a partially-cutaway plan view where the transformer 14*x* uses an EI core 33. FIG. 18 is a side view of FIG. 17. FIG. 17 shows a case where the transformer 14 is an X-phase transformer 14*x*, and the same configuration also applies to the Y-phase transformer 14*y* and Z-phase transformer 14*z*.

Through holes 32 are provided in a bobbin 34 of the transformer 14*x* using the EI core 33. In place of the primary-side coil of the transformer, the first metal plate 25*x*1 and second metal plate 25*x*2 are inserted into the through holes 32. The first metal plate 25*x*1 and the second metal plate 25*x*2 are connected to each other by a printed circuit board patterned wire 31. In FIGS. 17 and 18, a reference sign 35 denotes a secondary coil. In this manner, the same roll as the primary-side coil 27 of the transformer is satisfactorily played. Accordingly, application is possible to a toroidal core transformer using no bobbin 34 or a transformer of any other iron core type.

Figure 19:
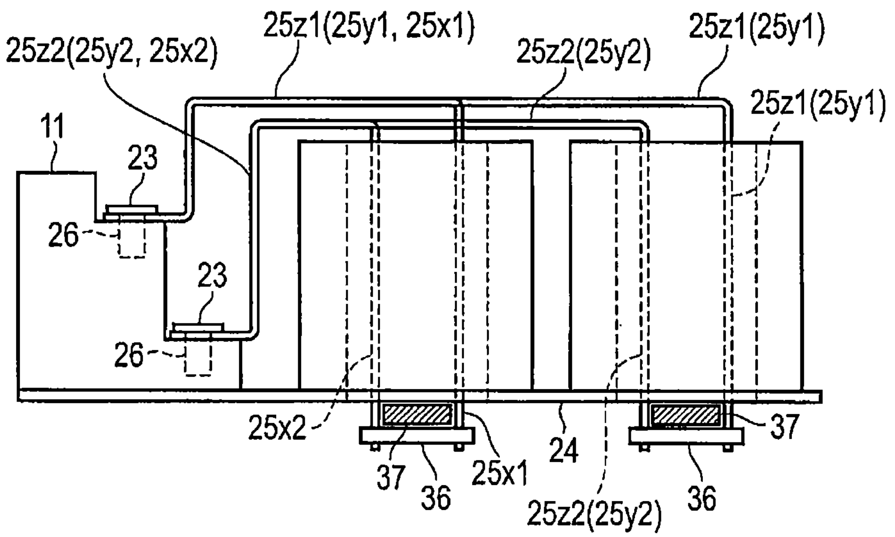
FIG. 19 is a plan view of Example 3 of the connection part between the terminal table of the current input converter and the X-, Y-, and Z-phase transformers according to the embodiment of the invention.

FIG. 19 is a plan view of Example 3 of a connection part between the terminal table 11 of the current input converter and the X-, Y-, and Z-phase transformers in the current input converter according to the embodiment of the invention. In this Example 3, in place of connecting the first metal plates 25*x*1 to 25*z*1 and second metal plates 25*x*2 to 25*z*2 by the patterned wires 31 on the back of the printed circuit board 24 in Example 2 shown in FIG. 16, the first metal plates 25*x*1 to 25*z*1 and the second metal plates 25*x*2 to 25*z*2 are connected by third metal plates 36 having solid shapes.

As shown in FIG. 16, where the first metal plates 25*x*1 to 25*z*1 and the second metal plates 25*x*2 to 25*z*2 are connected by the patterned wires 31 on the printed circuit board 24, there is a case that the patterned wires 31 on the printed circuit board 24 cannot ensure a pattern width or a pattern thickness which satisfies an aiming excessive current tolerance due to reasons of ensuring a mount area for surface components.

Hence, as shown in FIG. 19, the third embodiment utilizes a space 37 above a back of a printed circuit board 24 which first metal plates 25*x*1 to 25*z*1 and second metal plates 25*x*2 to 25*z*2 are made to penetrate, to connect the first metal plates 25*x*1 to 25*z*1 and the second metal plates 25*x*2 to 25*z*2 by third metal plates 36 having solid shapes and a low electrical resistance. In this manner, an aiming excessive current tolerance is satisfied.

FIG. 20 is a perspective view of FIG. 19 where a transformer 14*x* uses an EI core 33 and the printed circuit board 24 and a bobbin is are omitted herefrom. FIG. 20 shows a case where the transformer 14 is an X-phase transformer 14*x*, and the same configuration also applies to a Y-phase transformer 14*y* and a Z-phase transformer 14*z*.

Through holes 32 are provided in a bobbin 34 of the transformer 14*x* using the EI core 33. In place of a primary-side coil of the transformer, the first metal plate 25*x*1 and second metal plate 25*x*2 are inserted into the through holes 32. The first metal plate 25*x*1 and the second metal plate 25*x*2 are connected to each other by a printed circuit board patterned wire 31. In FIG. 20, a reference sign 35 denotes a secondary coil. In this manner, the same roll as the coil 27 on the primary side of the transformer is satisfactorily played. Accordingly, application is possible to a toroidal core transformer using no bobbin 34 or a transformer of any other iron core type.

Figure 21:
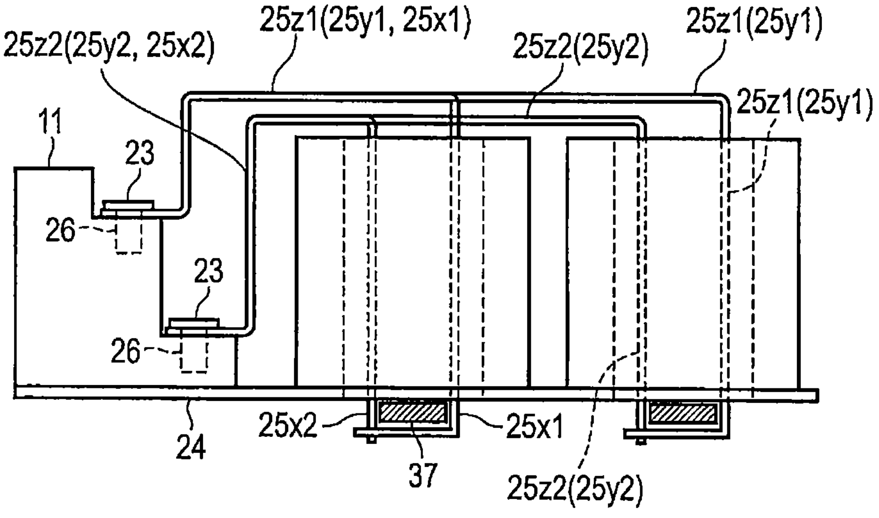
FIG. 21 is a plan view of Example 4 of the connection part between the terminal table of the current input converter and the X-, Y-, and Z-phase transformers according to the embodiment of the invention.

FIG. 21 is a plan view of Example 4 of the connection part between a terminal table 11 and X-, Y-, and Z-phase transformers of a current input converter. In this Example 4, in place of connecting first metal plates 25*x*1 to 25*z*1 and second metal plates 25*x*2 to 25*z*2 by patterned wires 31 on a back of a printed circuit board 24 in Example 2 shown in FIG. 16, at least the first metal plates 25*x*1 to 25*z*1 or the second metal plates 25*x*2 to 25*z*2 or both of the plates are folded to connect the first metal plates 25*x*1 to 25*z*1 and the second metal plates 25*x*2 to 25*z*2 to each other, on the back of the printed circuit board 24 which the first metal plates 25*x*1 to 25*z*1 and the second metal plates 25*x*2 to 25*z*2 are made to penetrate.

As shown in FIG. 16, where the first metal plates 25*x*1 to 25*z*1 and the second metal plates 25*x*2 to 25*z*2 are connected by the patterned wires 31 on the printed circuit board 24, there is a case that the patterned wires 31 on the printed circuit board 24 cannot ensure a pattern width or a pattern thickness which satisfies an aiming excessive current tolerance due to reasons of ensuring a mount area for surface components.

Hence, as shown in FIG. 21, Example 4 utilizes a space 37 above the back of the printed circuit board 24 which the first metal plates 25*x*1 to 25*z*1 and the second metal plates 25*x*2 to 25*z*2 are made to penetrate. The first metal plates 25*x*1 to 25*z*1 and the second metal plates 25*x*2 to 25*z*2 are made to penetrate primary sides of respectively corresponding transformers 14 mounted on the printed circuit board 24. Thereafter, for example, the first metal plates 25*x*1 to 25*z*1 are folded to connect the first metal plates 25*x*1 to 25*z*1 and the second metal plates 25*x*2 to 25*z*2 to each other. In this manner, an aiming excessive current tolerance can be satisfied, and no third metal plate 36 is required compared with Example 3. Therefore, the number of components is reduced, and cost reduction is achieved.

As described above, according to the embodiments of the invention, connection from a terminal table as an input unit to primary sides of internal transformers can be shortened, and an excessive current tolerance can be satisfied. In addition, work efficiency can be improved by preventing wiring errors.

The invention is not limited just to the embodiments described above but can be practiced by modifying components thereof without deviating from the subject matters of the invention in practical phases. Further, various inventions can be derived form appropriate combinations of a plurality of components disclosed in the foregoing embodiments. For example, several components may be deleted from all the components disclosed in the embodiments. Further, components of different embodiments may be appropriately combined with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current input converter comprising:

a terminal table which takes in an input current from outside;

a transformer which electrically isolates the input current taken in by the terminal table and converts the input current into a predetermined analog signal;

an analog-to-digital conversion circuit which converts the analog signal obtained by the transformer into a digital signal;

a first metal plate having a solid shape, which has one end attached to the terminal table and one other end attached to one end of a primary-side coil of the transformer, and connects the terminal table and the one end of the primary-side coil of the transformer to each other; and a second metal plate having a solid shape, which has one end attached to the terminal table and one other end attached to one other end of the primary-side coil of the transformer, and connects the terminal table and the other end of the primary-side coil of the transformer to each other;

wherein peripheries of the first metal plate and the second metal plate are covered with an electrically insulating coating or an electrically insulating material;

wherein the first metal plate and the second metal plate are made to penetrate a printed circuit board where the transformer is mounted, and the first metal plate and the second metal plate are connected to each other by a patterned wire on a back of the printed circuit board, thereby forming the primary-side coil of the transformer; and wherein in place of connecting the first metal plate and the second metal plate to each other by the patterned wire on the back of the printed circuit board, the first metal plate and the second metal plate are connected to each other by a third metal plate having a solid shape.

2. A current input converter comprising:

a terminal table which takes in an input current from outside;

a transformer which electrically isolates the input current taken in by the terminal table and converts the input current into a predetermined analog signal;

an analog-to-digital conversion circuit which converts the analog signal obtained by the transformer into a digital signal;

a first metal plate having a solid shape, which has one end attached to the terminal table and one other end attached to one end of a primary-side coil of the transformer, and connects the terminal table and the one end of the primary-side coil of the transformer to each other; and a second metal plate having a solid shape, which has one end attached to the terminal table and one other end attached to one other end of the primary-side coil of the transformer, and connects the terminal table and the other end of the primary-side coil of the transformer to each other;

wherein peripheries of the first metal plate and the second metal plate are covered with an electrically insulating coating or an electrically insulating material;

wherein the first metal plate and the second metal plate are made to penetrate a printed circuit board where the transformer is mounted, and the first metal plate and the second metal plate are connected to each other by a patterned wire on a back of the printed circuit board, thereby forming the primary-side coil of the transformer;

wherein in place of connecting the first metal plate and the second metal plate to each other by the patterned wire on the back of the printed circuit board, the first metal plate and the second metal plate are connected to each other by a third metal plate having a solid shape; and wherein in place of connecting the first metal plate and the second metal plate by the patterned wire on the back of the printed circuit board, the first metal plate and the second metal plate are connected to each other by folding at least one of the first metal plate and the second metal plate, on the back of the printed circuit board through which the first metal plate and the second metal plate are made to penetrate.

* * * * *